United States Patent [19]
Iida et al.

[11] Patent Number: 5,747,846
[45] Date of Patent: May 5, 1998

[54] PROGRAMMABLE NON-VOLATILE MEMORY CELL

[75] Inventors: Makio Iida, Ichinomiya; Tetsuo Fujii, Toyohashi; Yoshihiko Isobe, Toyoake, all of Japan

[73] Assignee: Nippondenso Co., Ltd., Kariya, Japan

[21] Appl. No.: 346,287

[22] Filed: Nov. 23, 1994

[30] Foreign Application Priority Data

Nov. 25, 1993 [JP] Japan .................................. 5-295475

[51] Int. Cl.$^6$ .................................................. H01L 27/10
[52] U.S. Cl. ........................ 257/314; 257/316; 257/312; 257/296; 257/298; 257/300; 365/185.1
[58] Field of Search ............................. 365/185.1, 140, 365/182; 257/312, 314, 316, 296, 298, 300

[56] References Cited

U.S. PATENT DOCUMENTS

| | | | |
|---|---|---|---|
| 4,616,245 | 10/1986 | Topich et al. | 357/23.5 |
| 5,078,498 | 1/1992 | Kadakia et al. | 365/185.1 |
| 5,086,325 | 2/1992 | Schumann et al. | 357/23.5 |
| 5,355,330 | 10/1994 | Hisamoto et al. | 365/140 |

FOREIGN PATENT DOCUMENTS

| | | |
|---|---|---|
| 2-97056 | 4/1990 | Japan. |
| 2-168646 | 6/1990 | Japan. |
| 5-211307 | 8/1993 | Japan. |

*Primary Examiner*—Viet Q. Nguyen
*Attorney, Agent, or Firm*—Cushman, Darby & Cushman IP Group of Pillsbury Madison & Sutro LLP

[57] ABSTRACT

A non-volatile memory cell having a structure having improved integration and simplified electrode wiring structure. The programmable non-volatile memory cell of the present invention adopts a mono-layer gate scheme to simplify the electrode wiring structure and to eliminate a current leakage problem of an insulating film between electrodes. A side and bottom of a semiconductor region, which is disposed directly below a capacity electrode section with a gate insulating film interposed therebetween that compose a control electrode, are isolated from another semiconductor region and semiconductor substrate by insulating films. Thus, a high programming control voltage which is not limited by a junction yield voltage between the semiconductor regions and semiconductor substrate may be applied. Due to that, an area of the capacity electrode section of a floating electrode may be considerably reduced.

13 Claims, 12 Drawing Sheets

PROGRAMMABLE NON-VOLATILE MEMORY CELL

CROSS REFERENCE TO RELATED APPLICATIONS

This application is based upon and claims priority from Japanese Patent Application No. 5-295475 filed on Nov. 25, 1993, the contents of which are incorporated herein by reference.

BACKGROUND OF THE INVENTION

1. Field of the Invention

The present invention relates to an electrically programmable non-volatile memory cell.

2. Related Art

Conventionally, it is know to employ a double layer gate type memory cell serving as an EEPROM or EPROM, i.e., an electrically programmable non-volatile memory cell (hereinafter simply referred to as a memory cell).

The double layer gate type memory cell has a structure in which a floating gate electrode and control gate electrode are layered. The two gate electrodes are made of polysilicon, for example, and an insulating film which is created by oxidizing the floating gate electrode is interposed between the two gate electrodes. It has been an important problem to prevent current leakage from the insulating film between the gate electrodes in order to maintain a charge of the floating gate electrode. It is then requested to increase a thickness of the film (above 0.6 μm for example) or to add an $Si_3N_4$ film. However, the increase of the thickness of the insulating film between the two gate electrodes invites a drop of capacitance between the gate electrodes, which necessitates increasing a control voltage, applied during programming, which is applied to the control gate electrode when electrons are injected to the floating gate electrode. This necessitates increasing a withstanding voltage of a transistor that controls the potential of the control gate electrode or increasing the capacitance between electrodes by increasing an area of the floating gate electrode and control gate electrode.

On the other hand, there is also known a mono-layer gate type memory cell.

As shown in FIG. 21, the mono-layer gate type memory cell comprises floating electrode 102, composed of gate electrode section 102a of MOS transistor 101 formed on the surface of semiconductor substrate 100 and capacity electrode section 102b formed by extending gate electrode section 102a, and control electrode 103, which is disposed directly under capacity electrode section 102b with an insulating film interposed therebetween and which is made of a semiconductor diffusion region which is separated from a channel region of MOS transistor 101 and semiconductor substrate 100 by pn junction. When a high potential is applied to control electrode 103, electrons are injected to floating gate electrode 102 and thereby programming is performed.

That is, the memory cell of this type allows remarkable simplification of its electrode wiring structure because the memory cell does not require a double-layer polysilicon electrode wiring structure, though its cell area increases as compared to a double-layer gate type memory cell. Furthermore, because a thermal oxide film having a high insulation resistance and high withstanding voltage that is fabricated by thermally oxidizing a substrate is used as the insulating film between the control electrode and the floating electrode, it may be thinly fabricated as compared to the above-mentioned insulating film between gate electrodes of the double-layer gate type memory cell, and therefore, the capacitance between electrodes may be increased in proportion to the thickness.

However, because the area of the floating electrode is significantly increased in the mono-layer gate type memory cell as compared to that of the double-layer gate type memory cell, a parasitic capacitance Cs is also increased accordingly. A potential change of control electrode 103 is capacitive-divided by a serial-parallel capacitor circuit composed of a capacitance Cf between control electrode 103 and floating gate section 102b, a capacitance Cg between gate electrode section 102a and the channel, and the parasitic capacitance Cs. Accordingly, it is necessary to apply a high programming control voltage to control electrode 103 or to enlarge control electrode 103 in order to inject electrons to floating electrode 102.

However, the PN junction between the $N^+$ region, which is control electrode 103, and the $P^-$ substrate (or a P well in a CMOS type) breaks down by an avalanche if the high voltage is applied to control electrode 103. Therefore, the programming control voltage must be set lower than this breakdown voltage. Accordingly, control electrode 103, which is the $N^+$ region, must be enlarged in order to inject electrons to floating electrode 102. However, because the enlargement of control electrode 103 proportionally invites a drop of integration, an integrable bit number is decreased. Since an improvement of integration is the most important subject of this type of semiconductor memory, this problem hinders practical use of the mono-layer gate type programmable non-volatile memory cell.

Furthermore, when such high programming control voltage is applied to control electrode 103, a depletion layer from the PN junction largely extends and stretches out around that. As a result, it is presumed that an undesirable punch-through effect is caused between neighboring high concentration region (e.g., a source region or drain region of the memory cell). In order to prevent such punch-through phenomena, it is necessary to dispose a wide field oxide film region around the $N^+$ region for control electrode 103. However, this also causes a significant drop of integration.

SUMMARY OF THE INVENTION

Accordingly, it is an object of the present invention to solve the aforementioned problems by providing a programmable non-volatile memory cell having a structure which allows the realization of both improved integration and a simplified electrode wiring structure.

The programmable non-volatile memory cell of the present invention comprises a MOS transistor formed on a surface of a semiconductor substrate, a floating electrode composed of a gate electrode section of the MOS transistor and a capacity electrode section formed by extending the gate electrode section, a control electrode composed of a one-conductivity type semiconductor region disposed directly under the capacity electrode section with an insulating film interposed therebetween, and an insulator surrounding a side and bottom of the semiconductor region forming the control electrode.

Preferably, a side and bottom of a control transistor for applying a programming control voltage to the control electrode when electrons are injected to the floating electrode is isolated from another semiconductor region and semiconductor substrate by an insulator.

According to the programmable non-volatile memory cell of the present invention, the semiconductor region which forms the control electrode is disposed directly under the capacity electrode section with the insulating film interposed therebetween, and the side and bottom of the semiconductor region are surrounded by the insulator. Accordingly, because the semiconductor region, which forms the control electrode, is isolated from the other semiconductor region and semiconductor substrate by the insulator, a high programming control voltage may be applied without being limited as in the past. Thus, an area between the capacity electrode section of the floating electrode and the semiconductor region for the control electrode may be considerably reduced and thereby the improvement of integration and the improvement of utilization factor of the applied voltage, due to the reduction of the parasitic capacitance, may be realized.

Furthermore, because the side and bottom of the semiconductor region for the control electrode are isolated from the other semiconductor region and semiconductor substrate by the insulating film, a gap between the semiconductor region for the control electrode and the other semiconductor region may be decreased. As a result, the cell area may be reduced and the integration may be considerably improved.

As a result, the simplification of the electrode wiring structure and the improvement of integration of the programmable non-volatile memory cell may be realized.

The above and other related objects and features of the present invention will be apparent from a reading of the following detailed description, the appended claims, and the accompanying drawings, all of which form a part of this application.

DETAILED DESCRIPTION OF THE PRESENTLY PREFERRED EXEMPLARY EMBODIMENTS

[First Embodiment]

Figure 1:
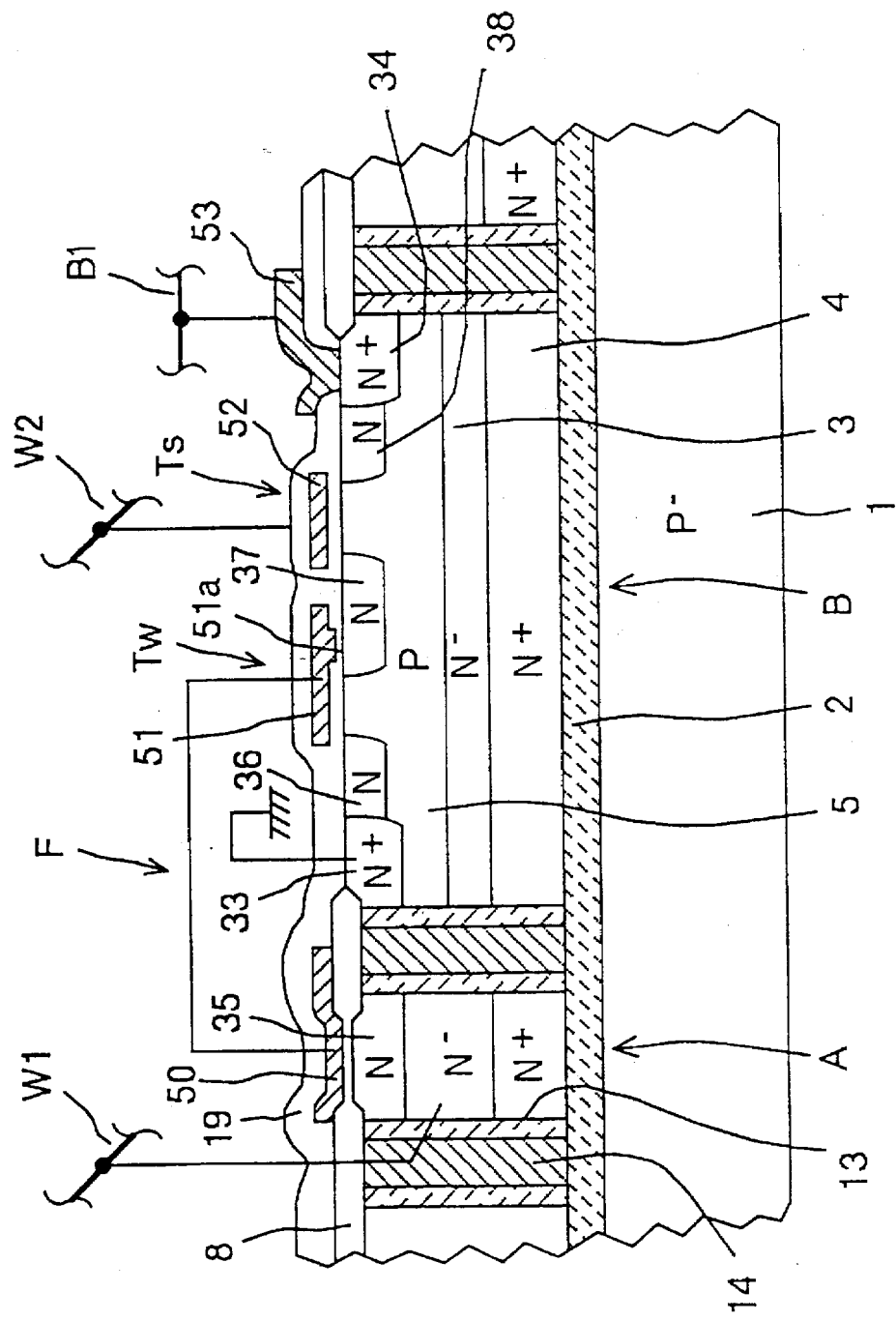
FIG. 1 is a sectional view of an EEPROM according to a first embodiment.

Referring now to the drawings, one preferred embodiment of a memory cell of an EEPROM to which the present invention has been applied will be explained. FIG. 1 shows a sectional view of the memory cell.

In the figure, the reference numeral and character 1 denotes $P^-$ silicon substrate (semiconductor substrate), 2 internal insulating film (an insulative base composed of silicon substrate 1 and insulating film 2), 3 $N^-$ region, 4 embedded $N^+$ layer, 5 P well, 33 $N^+$ source region, 34 $N^+$ drain region, 35–38 N type regions, and A and B island semiconductor regions. Island semiconductor region A forms a semiconductor region for the control electrode and island semiconductor region B forms a memory cell.

The reference numeral 13 denotes insulator isolating wall made of a silicon oxide film, 14 polysilicon region filled in a trench, 8 field oxide film made of a LOCOS oxide film, 19 interlayer insulating film, 50 capacity electrode section of floating electrode F made of a polysilicon electrode, 51 gate electrode section of floating electrode F made of a polysilicon electrode, 52 a selection gate electrode made of a polysilicon electrode, and 53 an aluminum electrode which is also a bit line B1. A MOS capacitor is formed by capacity electrode section 50 and N type region 35 in the semiconductor region for control electrode A and a MOS transistor having a gate of gate electrode section 51 is formed in the semiconductor region for memory cell B.

N type regions 36, 37 and 38 function as a low concentration source region or drain region for improving a withstanding voltage of the MOS transistor. N type regions 37 and 38 and selection gate electrode 52 form selection transistor Ts and N type regions 36 (and $N^+$ region 33) and 37 and gate electrode section 51a form floating gate transistor Tw.

Here, island semiconductor region A, the bottom and side of which are insulated and isolated by insulator isolating wall 13 and internal insulating film 2, is made common to memory cells in the same row, and is extended straight. Island semiconductor region A is connected to first word line W1 at a region where capacity electrode section 50 is not disposed on the top of it (not shown). This first word line W1 is made of an aluminum electrode and extends in the same direction as the extending direction of semiconductor region A.

Island semiconductor region B is formed into a rectangular shape having a certain size corresponding to each memory cell and the bottom and side thereof are insulated and isolated by insulator isolating wall 13 and internal insulating film 2. $N^+$ source region 33 is grounded, for example, by an aluminum electrode (not shown). Gate electrode 52 of selection transistor Ts is connected to a second word line W2.

Capacity electrode section 50 and gate electrode section 51 are polysilicon electrodes which are formed in one body in the same process and compose floating electrode F of the present invention. Gate electrode section 51 is disposed on a channel of floating gate transistor Tw with a gate oxide film having a certain thickness interposed therebetween and is disposed on N type region 37 with tunnel oxide film 51a made of a silicon oxide film of about several nanometers interposed therebetween. Similarly, capacity electrode section 50 is formed on N type region 35 with an oxide film having a certain thickness interposed therebetween.

Next, programming, erasing and reading operations of this memory cell will be explained individually. However, these operations are just examples and other operating modes are, of course, possible.

When "1" or "0" is to be written into a cell on a certain line, a programming control voltage having a high level potential (hereinafter a potential which is large in the positive direction) is given to the first word line (row selection line) W1 of that row. As a result, a channel right under gate electrode section 51 is formed and a potential of the N type region 37 is equalized (grounded) to that of second silicon substrate 33 through this channel.

At this time, a row selection voltage having a high level potential is given concurrently to second word line (row selection line) W2 of that row to conduct a channel right under electrode 52. Then, a high level potential is given to a column line (bit line) B of a cell into which "0" is to be written (no electron is injected to the floating electrode F) and a ground potential is applied to the bit line B of a cell into which 1 is to be written (electron is injected to the floating electrode F).

Because both the bit line B ($N^+$ region 34) and $N^+$ region 33 of the cell wherein electrons are injected to the floating electrode F are at ground potential, which is the least potential in the positive direction, N type region 37 becomes the ground potential. As a result, a large voltage is applied between electrode 51, which is swung in the positive direction by region 35, and N type region 37, which is at ground potential, and electrons of region 37 are injected to electrode 51 through tunnel insulating film 51a, and thereby "1" is written into the cell.

On the other hand, the bit line ($N^+$ region 34) of the cell wherein no electrons are injected to floating electrode F is at a high level. As a result, an intermediate potential caused by dividing a potential difference of region 34 and region 33 by a resistance of the channels is applied to region 37. As a result, a voltage between electrode 51, which is swung by region 35 in the positive direction, and region 37, which is in the intermediate potential, becomes small. Accordingly, electrons of region 37 cannot be injected to electrode 51 going through the tunnel insulating film 51a, and thereby 0 is written into the cell.

At this time, the potential of the first and second word lines W1 and W2 of non-selected rows remains at a low level and the memory contents of the cell do not change.

Electrons injected to floating electrode F of a cell of a certain row may be erased in the following manner.

A low level potential (hereinafter a potential small in the positive direction) is applied to first word line W1 of that row. As a result, the channel below the electrode 51 is extinguished and the conductivity between region 33 and N type region 37 is cut off.

At the same time, a high level potential is applied to second word line W2 of that row and a particularly high level potential for erasing is applied to all bit lines B1. As a result, the level of the potential of region 37 becomes particularly high together with region 34 through the channel below electrode 52. On the other hand, because the potential of region 35 remains at a low level, electrons in electrode 51 are pulled out to region 37 through tunnel insulating film 51a.

The particularly high level potential is applied to the bit line B1 in order not to cause an erroneous erasure operation during a reading operation (described later) during which first word line W1 also remains at a low level potential even through a high level potential is applied to second word line W2 and a certain degree of high level potential is also applied to the bit line.

Although two potentials of a high level potential and a low level potential may be applied to the bit line B1 and three potentials of a high level potential during writing, an intermediate potential during hold and a low level potential during erasure may be applied to first word line W1, explanation thereof will be omitted here since they are not the essential point of the present invention.

A reading operation is implemented by applying a low level potential to first word line W1 of that row, applying a high level potential to second word line W2 of that row and applying an intermediate high level potential to the bit line of the all columns.

Thereby, since a channel resistance directly under electrode 51 differs in the cell wherein electrons have been injected to electrode 51 and in the cell wherein no electron has been injected and an amount of electron flowing out from region 33 to the bit line B of each column differs, it may be sensed by a sense amplifier (not shown) connected to each bit line.

Figure 19:
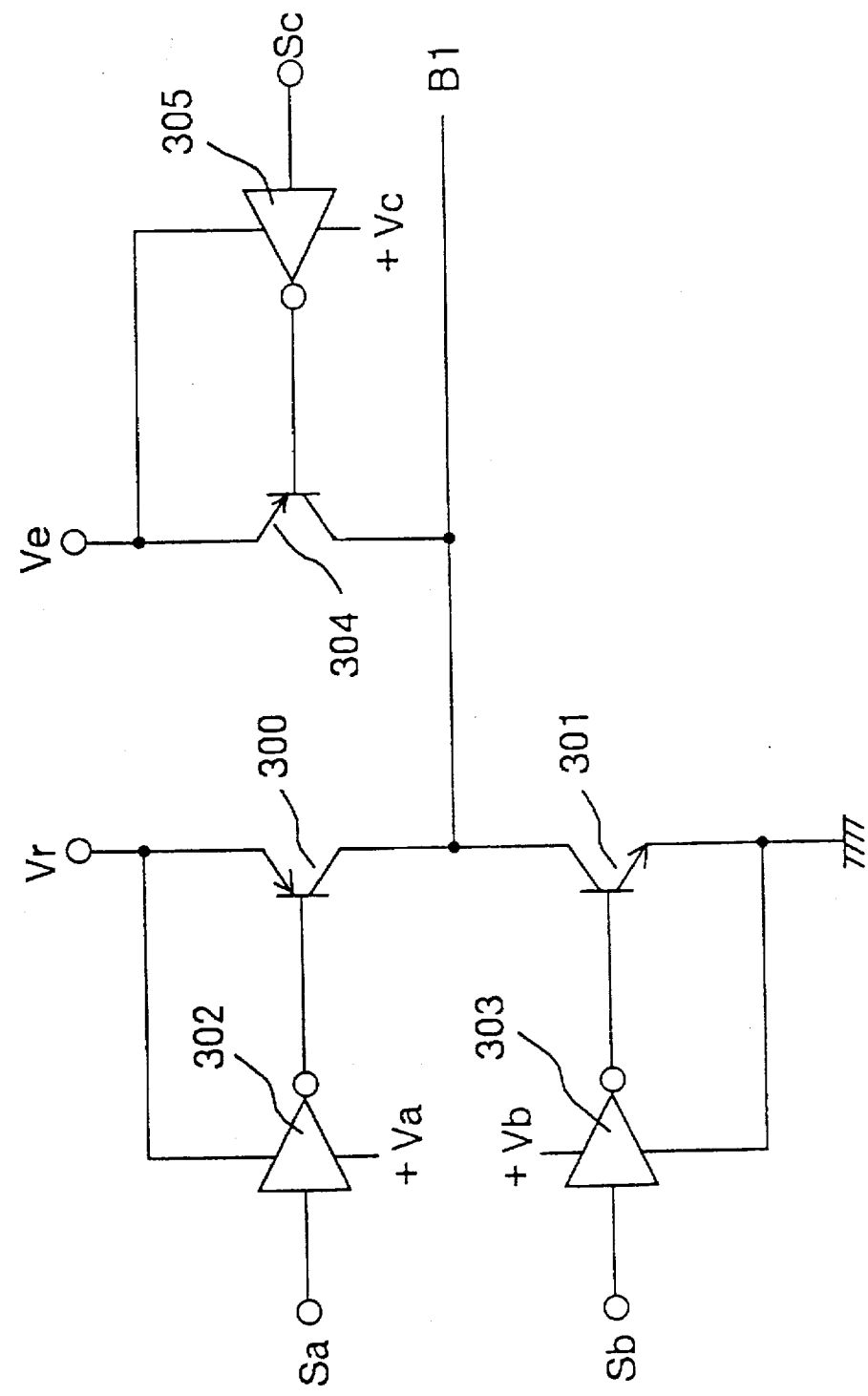
FIG. 19 is a circuit diagram of a line driver circuit which drives the memory cell in the first embodiment.

FIG. 19 shows line driver circuits for applying the low level potential, high level potential and deepest high level potential (erasing potential) to the bit line B1 used in the present embodiment. These line driver circuits are constructed by Bi-CMOS circuits and are excellent in terms of a voltage utilization factor and power consumption. Because this Bi-CMOS line driver circuit needs to be driven by a high voltage, it is preferable to fabricate the circuit by an SOI process according to the present invention in terms of insulating isolation and withstanding voltage.

In the figure, the reference numeral 300 denotes lateral pnp bipolar transistor and 301 planar npn bipolar transistor whose emitter is grounded. The two transistors compose an inverter amplifier. The reference numeral 304 denotes also lateral pnp bipolar transistor and the transistors 301 and 304 also compose an inverter amplifier.

High level voltage Vr, for writing and reading, is applied to an emitter of lateral pnp bipolar transistor 300, and high level voltage Ve for erasing is applied to an emitter of lateral pnp bipolar transistor 304.

Transistor 300 is controlled by CMOS inverter 302, transistor 301 is controlled by CMOS inverter 303, and transistor 304 is controlled by CMOS inverter 305. A potential difference Vr–Va, which is less than a withstanding voltage of CMOS inverter 302, is applied to both ends of CMOS inverter 302, a potential difference Vb which is less than a withstanding voltage of CMOS inverter 303 is applied to both ends of CMOS inverter 303, and a potential difference Ve–Vc, which is less than a withstanding voltage of CMOS inverter 305, is applied to both ends of CMOS inverter 305. By doing so, a high speed and high withstanding voltage line driver having a capability of driving a large current and causing small losses of DC power may be constructed. Furthermore, the transistors are closely gathered from each other, while at the same time allowing themselves to be electrically insulated by doping impurities or by forming a gate electrode to the island semiconductor regions whose side and bottom are isolated by the insulators to create the Bi-CMOS circuit in the present embodiment.

It is apparent in FIG. 19 that Vr may be applied to the bit line B1 by turning on the transistor 300 and by turning off the transistors 301 and 304. 0 V may be applied by turning on the transistor 301 and by turning off the transistors 300 and 304. Ve may be applied by turning on the transistor 304 and turning off the transistors 300 and 301.

Next, a process for fabricating the bonded type SOI semiconductor device will be explained with reference to FIGS. 2 through 14.

Figure 2:
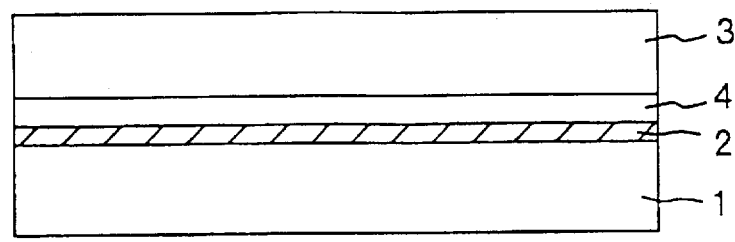
FIGS. 2 through 14 are sectional views showing a fabrication process of the cell of the first embodiment.
Figure 3:
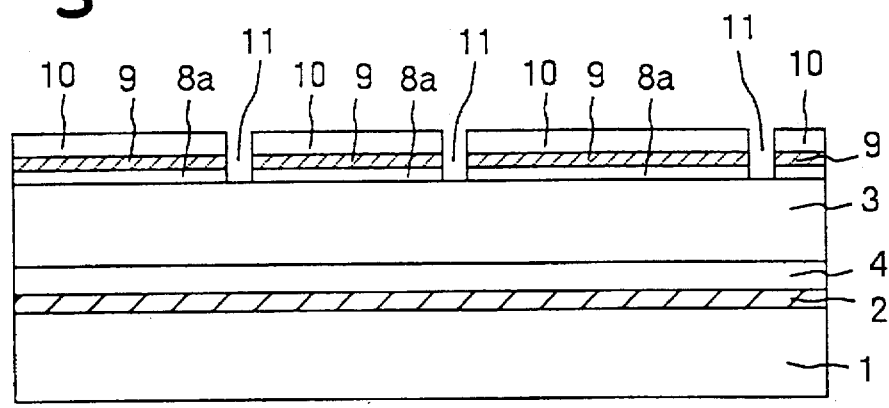
Figure 4:
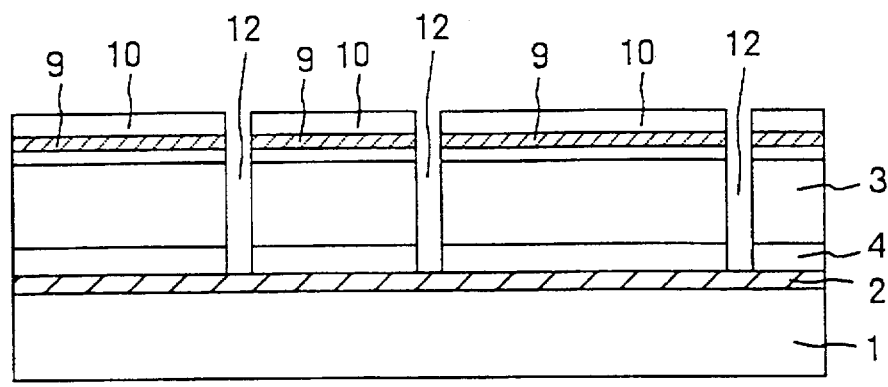
Figure 5:
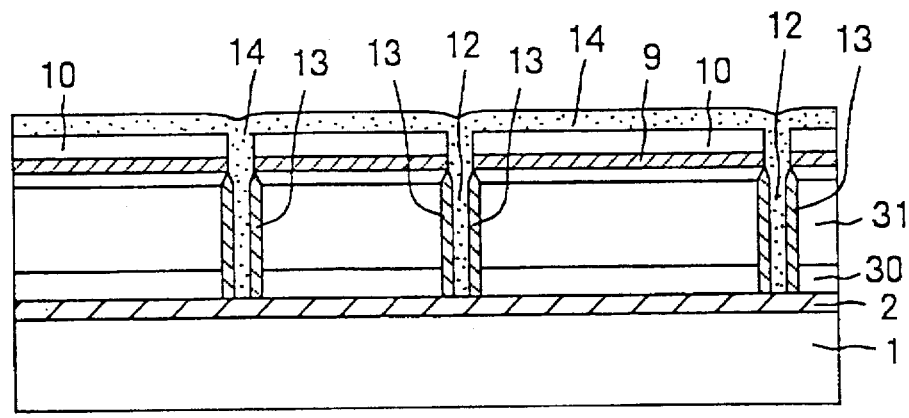

After polishing like a mirror, one main surface of $P^{31}$ type first mono-crystal silicon substrate 1 is thermally oxidized to form insulating film 2 having a predetermined thickness. Then, second mono-crystal silicon substrate 3 having a main surface polished like a mirror is adhered to insulating film 2 side and heated in a fully clean atmosphere to bond in one body so as to sandwich the insulating film 2 between silicon substrates 1 and 3. Next, second mono-crystal silicon substrate 3 is polished to a predetermined thickness. Thereby, an SOI substrate structured by bonding second silicon substrate 3 on the first silicon substrate 1 interposing the insulating film 2 is fabricated (see FIG. 2). In FIG. 2, the reference numeral 4 denotes an N type high concentrate impurity layer formed by doping antimony (Sb) and arsenic (As) from the surface of second N⁻ silicon substrate 3 before bonding to silicon substrate 1. Then, pad oxide film 8a is formed on the surface of the second silicon substrate 3 by thermal oxidation and an $Si_3N_4$ film 9 as a first insulating layer and an $SiO_2$ film 10 as a second insulating layer are deposited on the surface the pad oxide film 8a individually by a CVD method. Then, they are annealed at 1,000° C. to minutely densify $SiO_2$ film 10. Next, a resist (not shown) is deposited, a known photolithographic process and a reactive ion etching (RIE) process using $CF_4$ or $CHF_3$ series gas as an etching gas are implemented, and $SiO_2$ film 10, $Si_3N_4$ film 9, and pad oxide film 8a are selectively etched until reaching the surface of second silicon substrate 3 using the resist formed on the surface of $SiO_2$ film 10 as a mask to create openings 11 (see FIG. 3). FIG. 3 shows a state where the resist has been stripped off.

Next, second silicon substrate 3 is selectively etched by the RIE process using a HBr series gas as an etching gas and using $SiO_2$ film 10 as a mask to create trenches 12. The thickness of $SiO_2$ film 10 is determined so that the isolation trenches 12 may successfully reach to insulating film 2 in accordance with a selected etching ratio of $SiO_2$ film 10 and second silicon substrate 3.

Next, a chemical dry etching (CDE) process is applied to the surface of an inner wall of isolation trench 12. The CDE process is carried out using a RF discharge type plasma etching unit and under conditions of material gases of $CF_4$, $O_2$, $N_2$, a frequency of 13.56 MHz, an etching rate of 150 nm/min., and a distance from plasma wafer of 100 cm, for example. Thereby, the inner wall of isolation trench 12 is etched by about 150 nm.

Next, the inner wall of the isolation trench 12 treated by the CDE is annealed. This annealing process is performed by heating for 30 minutes at 1,000° C. in a $N_2$ atmosphere for example.

Incidentally, a sacrificial oxidation process may be implemented on the annealed inner wall of the isolation trench 12. The sacrificial oxidation process is performed, for example, by forming a sacrificial oxide film of 50 nm by means of dry oxidation at 1,000° C. and then removing it by hydrofluoric acid (see FIG. 4).

Next, insulating coating film 13 is formed on the inner wall of isolation trench 12 by means of wet thermal oxidation at 1,0500° C. for example and then polysilicon 14 is deposited on it by means of an LP-CVD method. At this time, polysilicon 14 not only fills isolation trench 12 but is also deposited on $SiO_2$ film 10 (see FIG. 5).

Figure 6:
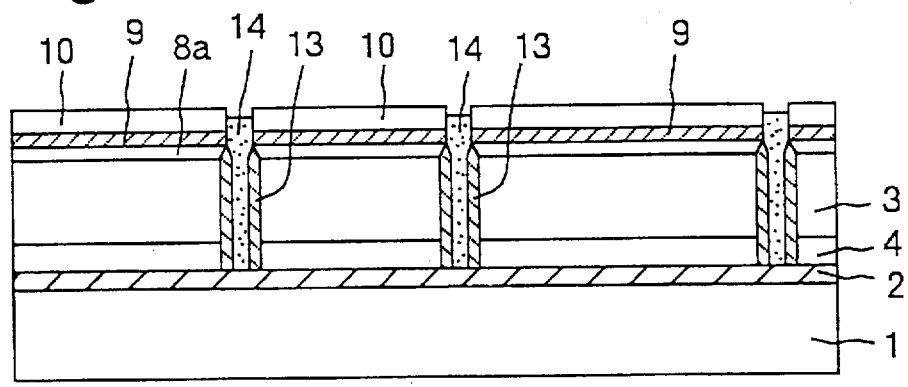

Next, an extra part of polysilicon 14 deposited on $SiO_2$ film 10 is etched back (first time) by a dry etching process (see FIG. 6). At this time, the etching is stopped so that the upper end of polysilicon 14 remaining in the isolation trench 12 comes above $Si_3N_4$ film 9.

Figure 7:
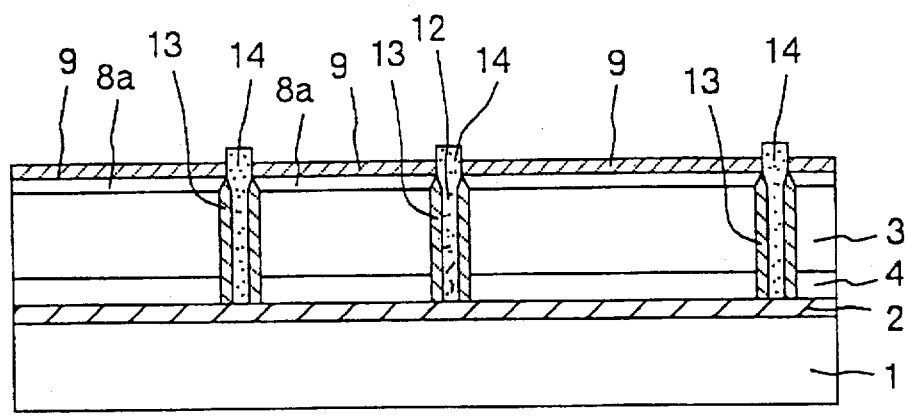

Next, $SiO_2$ film 10 is etched off by means of a wet etching process using a fluorine solution (see FIG. 7). At this time, $Si_3N_4$ film 9 and polysilicon 14 left so that its upper end comes above $Si_3N_4$ film 9 act as an etching stopper, so that pad oxide film 8a and insulating coating film 13 formed on the inner wall of isolation trench 12 are not etched.

Figure 8:
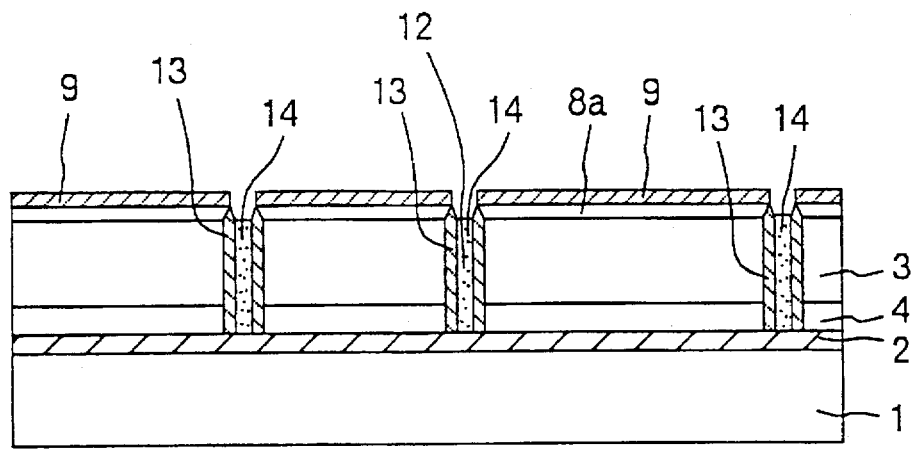
Figure 9:
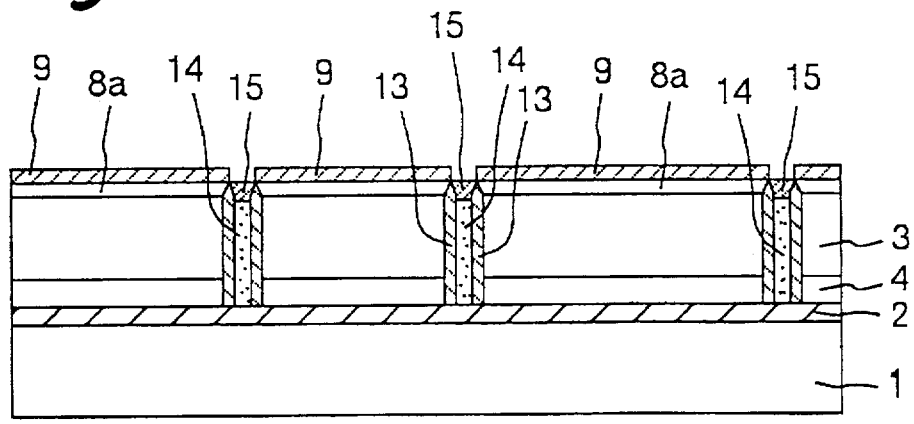

Next, the portion of polysilicon 14 filled in isolation trench 12 which projects above $Si_3N_4$ film 9 is etched back (second time) by a dry etching process (see FIG. 8). At this time, it is desirable to control the etching so that the upper end of polysilicon 14 comes below the upper end of pad oxide film 8a by about 0.3 μm so that heights of thermal oxide film 15 (described later) and of its surrounding pad oxide film 8a become equal when thermal oxide film 15 is grown on the top of polysilicon 14 within the trench in the next process.

Figure 10:
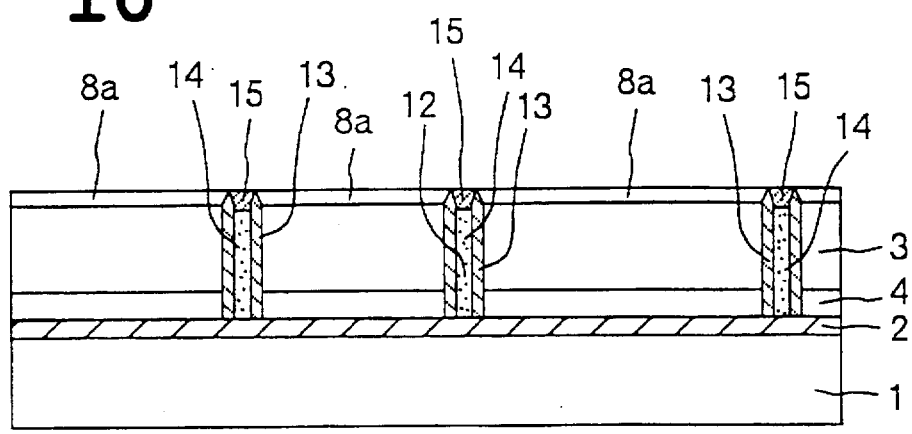

Then, after selectively thermally oxidizing the top of polysilicon 14 filled in isolation trench 12 using $Si_3N_4$ film 9 as an oxygen-impermeable film to grow oxide film 15 (see FIG. 9), then $Si_3N_4$ film 9 is etched off (see FIG. 10). As it is apparent from FIG. 10, an area of isolation trench 12 is kept flat without forming any differences in level.

Figure 11:
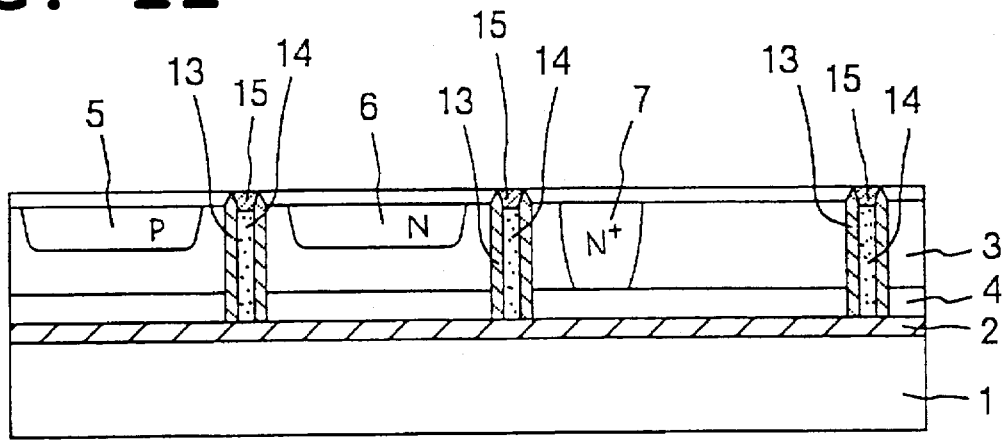

Then, P well region 5, N well region 6 and deep N+region 7 are formed in each island region of second silicon substrate 3 made into the SOI layer by means of a known photolithography and impurity diffusing process (see FIG. 11).

Figure 12:
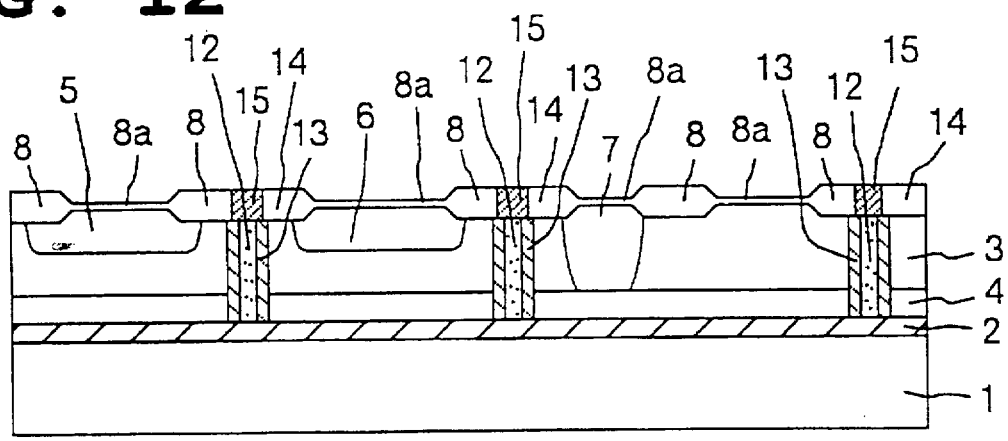

After that, field oxide film 8 is formed on the surface of second silicon substrate 3 by a local oxidation of silicon (LOCOS) method (see FIG. 12). The LOCOS method is a process for forming thick field oxide film 8 by oxidizing regions on which no $Si_3N_4$ film is formed by thermal oxidation or the like after forming the $Si_3N_4$ film again as an oxidation deterring film at predetermined regions on the surface of the substrate. FIG. 12 shows a state in which the $Si_3N_4$ film has been removed by $H_3PO_4$ after oxidizing by the LOCOS method.

Figure 13:
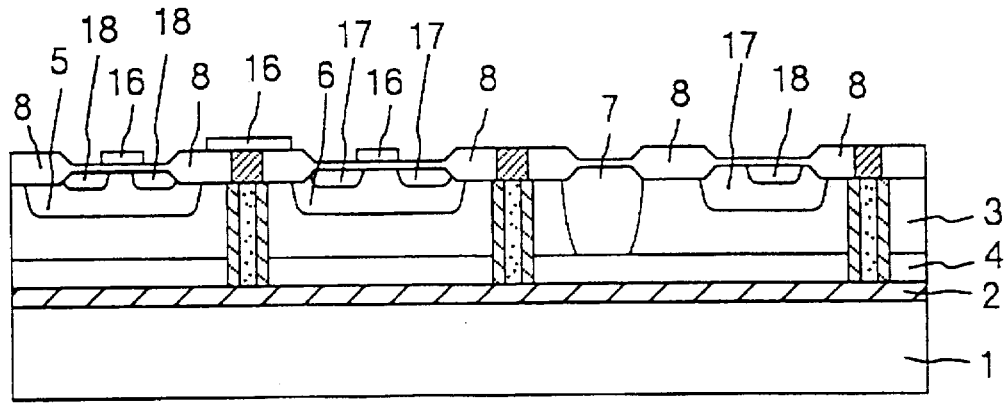

Next, after removing pad oxide film 8a, the gate oxide film and tunnel oxide film 51a are formed. Then, polycrystal silicon wires (gate electrodes) 50, 51 and 52, in FIG. 1, are formed by implementing an LP-CVD process, photolithography and etching process. Further, N type regions 35–38 and gate electrode 16, P⁺ diffusion layer 17 and N⁺ diffusion layer 18 of other semiconductor devices shown in FIG. 13 are formed by selective doping.

Figure 14:
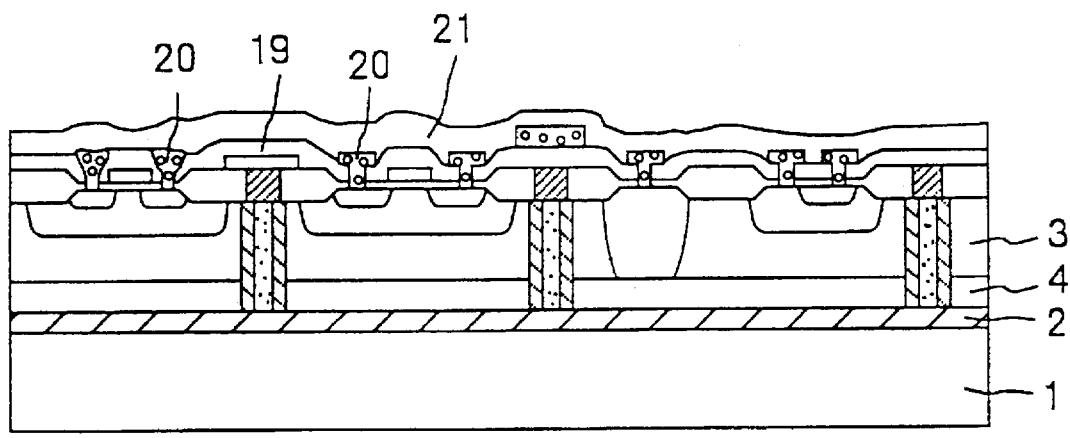

Following that, interlayer insulating film 19 such as PSG and BPSG is deposited and contact holes are created at necessary parts to form aluminum wires 20 and 53 (FIG. 1) as shown in FIG. 14. Then, protection film 21 made of a nitride film or the like is formed by a plasma CVD, thus completing the fabrication of the B1-CMOS semiconductor device in which the CMOS transistors and bipolar transistors are composited.

While FIG. 14 shows the NMOS transistor, PMOS transistor and npn bipolar transistor, it is apparent that the lateral pnp bipolar transistor may be fabricated by the same process and that the memory cell in FIG. 1 may be fabricated by using the above-mentioned manufacturing process.

As described above, the semiconductor region A disposed directly under capacity electrode section 50 with an insulating film interposed therebetween to form control electrode 35 is disposed in the memory of the present embodiment and its side and bottom are surrounded by insulators 2 and 13. Accordingly, because the semiconductor region A which forms control electrode 35 is isolated by the insulators from the other semiconductor region B and semiconductor substrate 1, the programming control voltage is not limited like in the prior art and a high programming control voltage may be applied. Due to that, the width of the gap between capacity electrode section 51 of floating electrode F and control electrode 35 may be significantly reduced, and the improvement of integration and the improvement of utilization of factor of the applied voltage, due to the reduction of parasitic capacitance, may be realized.

Furthermore, because the side and bottom of the semiconductor region for control electrode A are isolated from the other semiconductor region B and semiconductor substrate 1 by insulating films 2 and 13, the semiconductor region for control electrode A and the other semiconductor region B may be brought closer and as a result, the reduction of cell area and the improvement of integration may be realized.

As a result, the simplification of electrode wiring structure and the improvement of integration of the programmable non-volatile memory cell may be realized.

Figure 15:
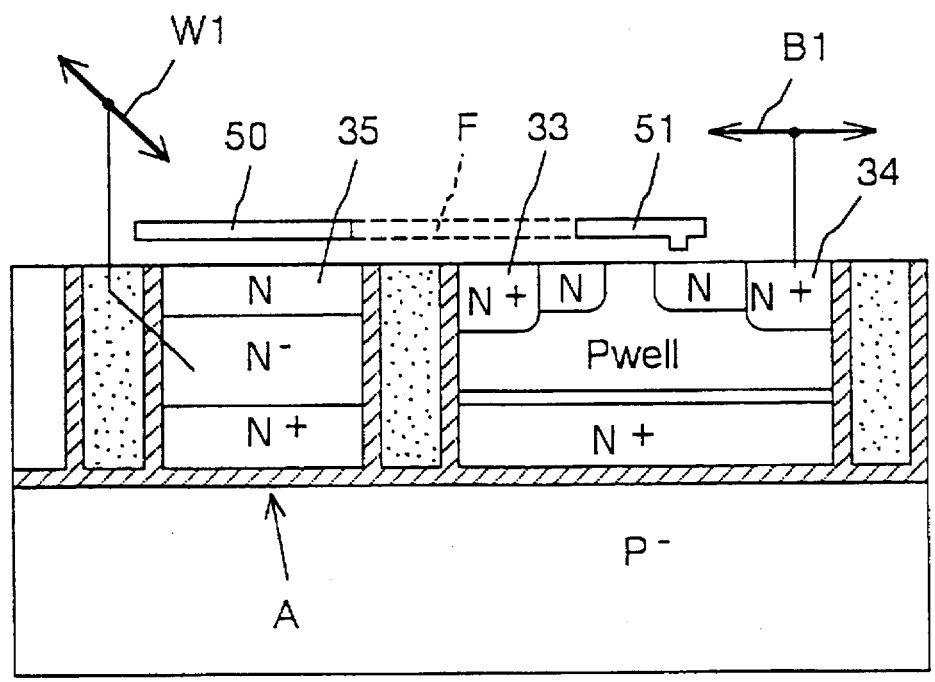
FIG. 15 is a sectional view showing a modified mode of the first embodiment.

Selection transistor Ts may be omitted as shown in FIG. 15 in the first embodiment.

Figure 16:
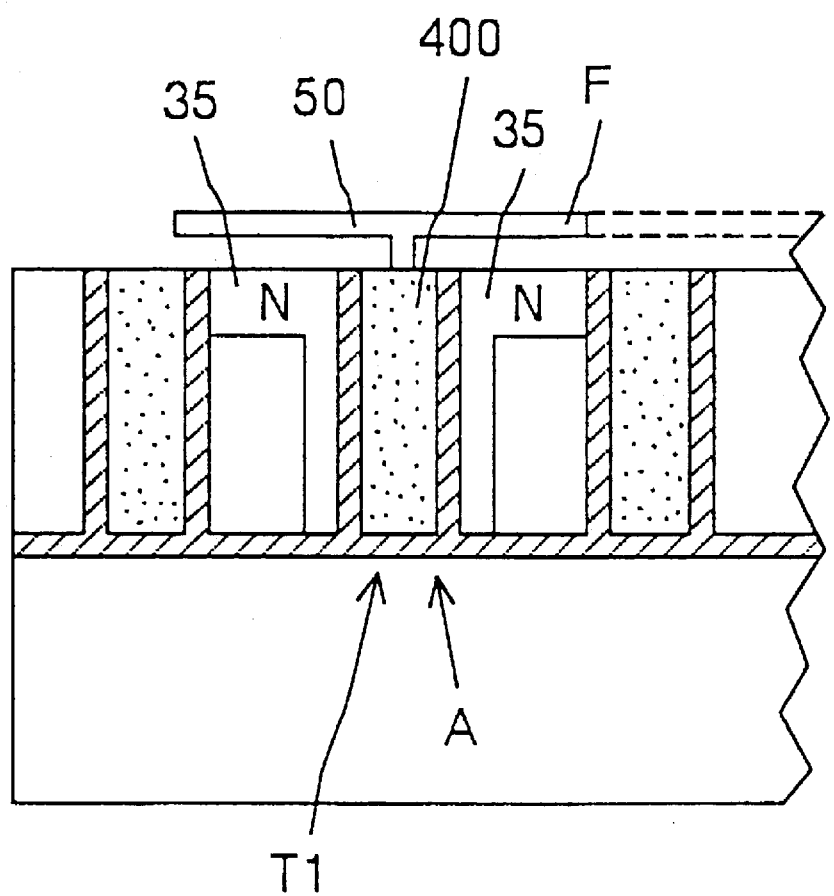
FIG. 16 is a sectional view showing another modified mode of the first embodiment.

Further, capacity electrode section 50 of floating electrode F may be connected to polysilicon filled-in region 400 within a trench T1 disposed in the middle of the island semiconductor region A as shown in FIG. 16. By doing so, an effective capacitance of capacity electrode section 50 may be increased without increasing the cell area.

[Second Embodiment]

Figure 17:
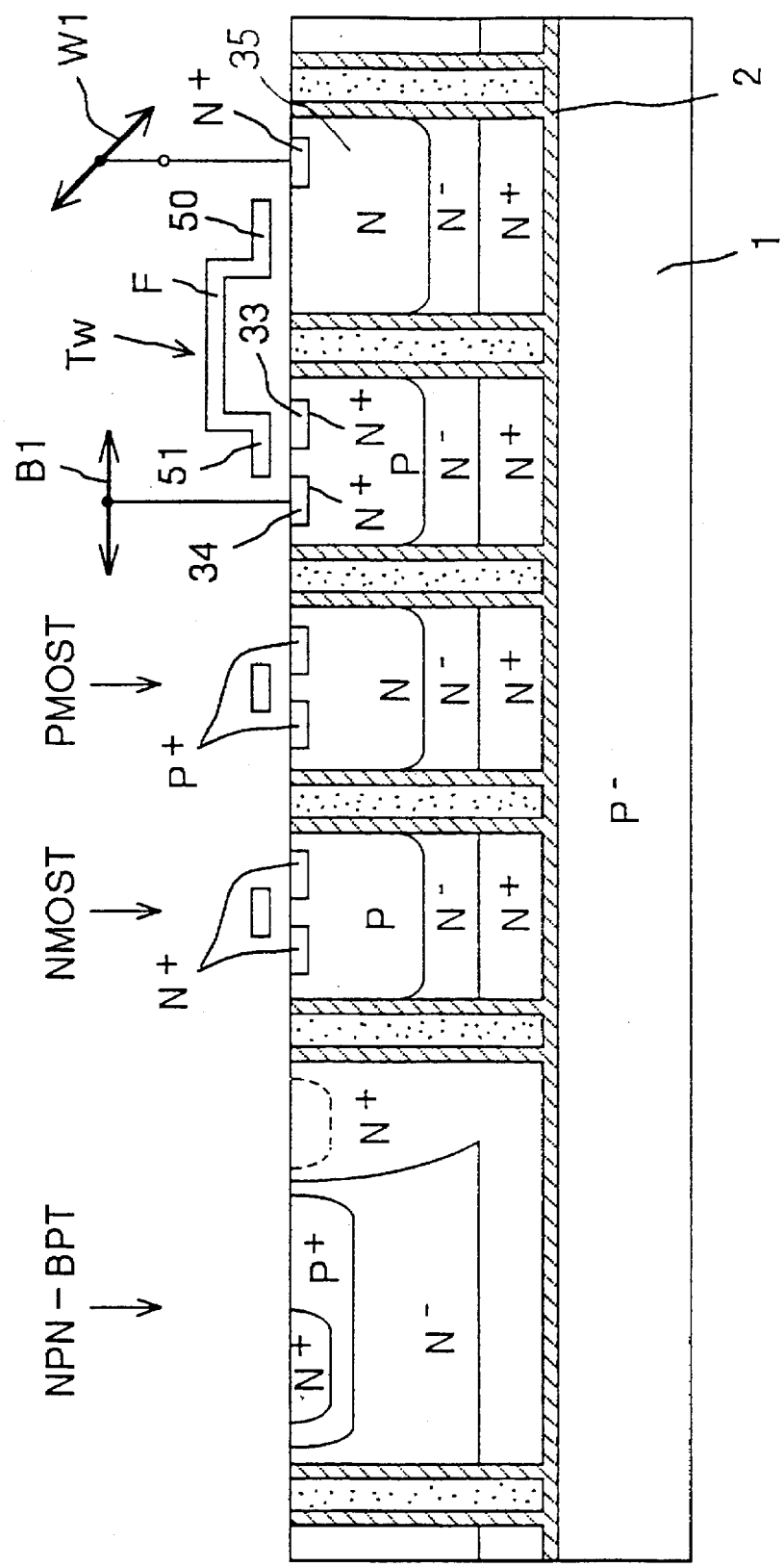
FIG. 17 is a sectional view showing an EPROM cell according to a second embodiment.

One preferred embodiment of a LSI in which EPROM memory cells to which the present invention is applied are integrated will be explained with reference to FIG. 17.

In the LSI, the bipolar transistors are used as a high precision analog circuit and for an input circuit section and output circuit section, utilizing its high withstanding voltage. The use of the bipolar transistor for the input and output circuit sections allows suppressing such an effect such as a surge. On the other hand, a digital circuit is composed by CMOS transistor, utilizing its high integration. Then, the EPROM having the SOI structure is used for a memory cell array section necessary for adjusting an output sensitivity of a semiconductor pressure sensor, for example, or as an element for electrically adjusting a high precision analog circuit or as a memory in a digital circuit. When the EPROM is used as an adjusting element of an input/output circuit, an element region will not become so large as described in the first embodiment even if it is the mono-layer EPROM having the SOI structure, because not so many elements are required. In addition to that, because it has the mono-layer gate structure, its fabrication process is not complicated and it can be fabricated in the same time with the Bi-CMOS.

Figure 20:
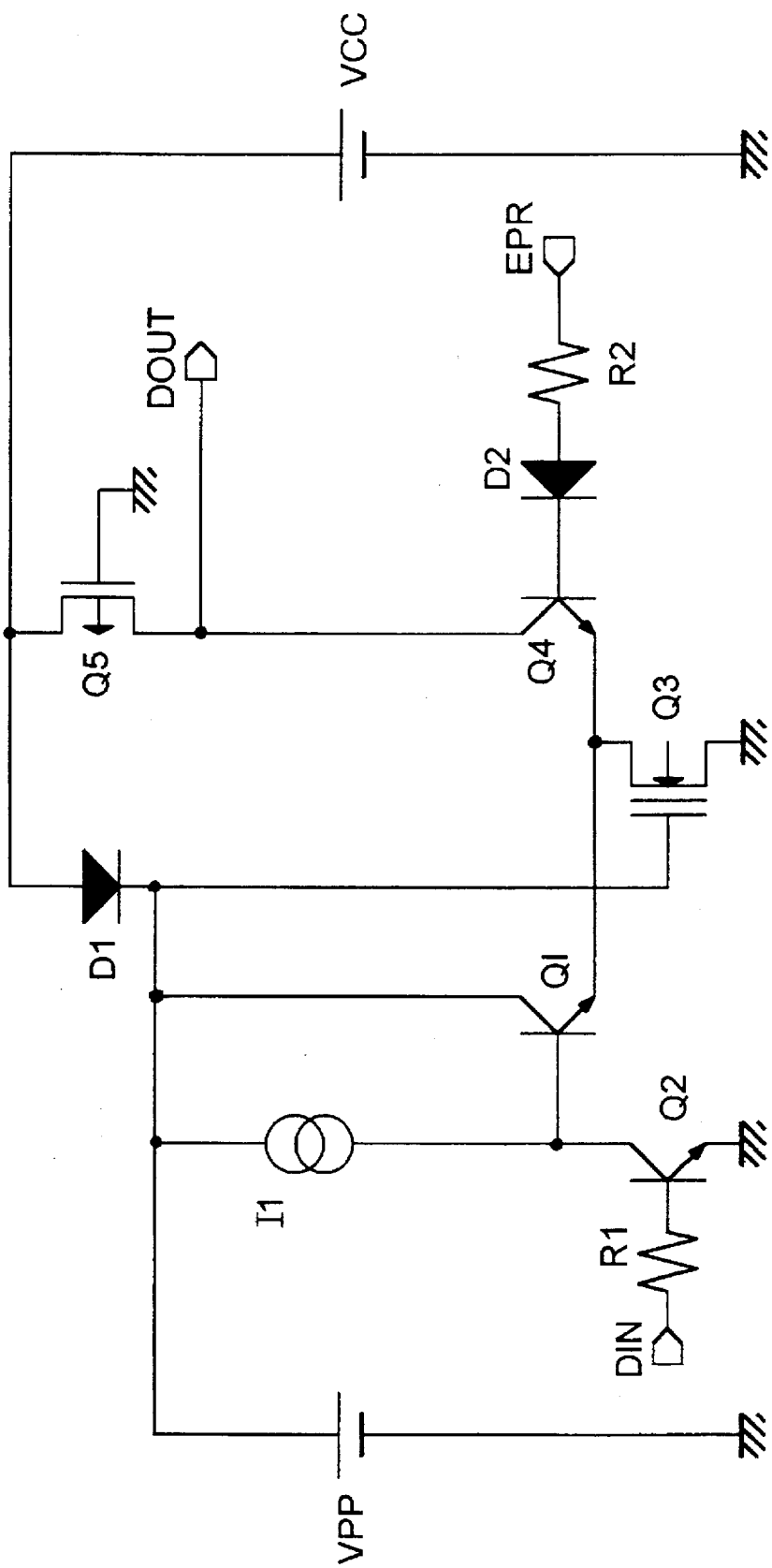
FIG. 20 is an equivalent circuit diagram for performing an operation for programming the EPROM cell of the second embodiment.
Figure 21:
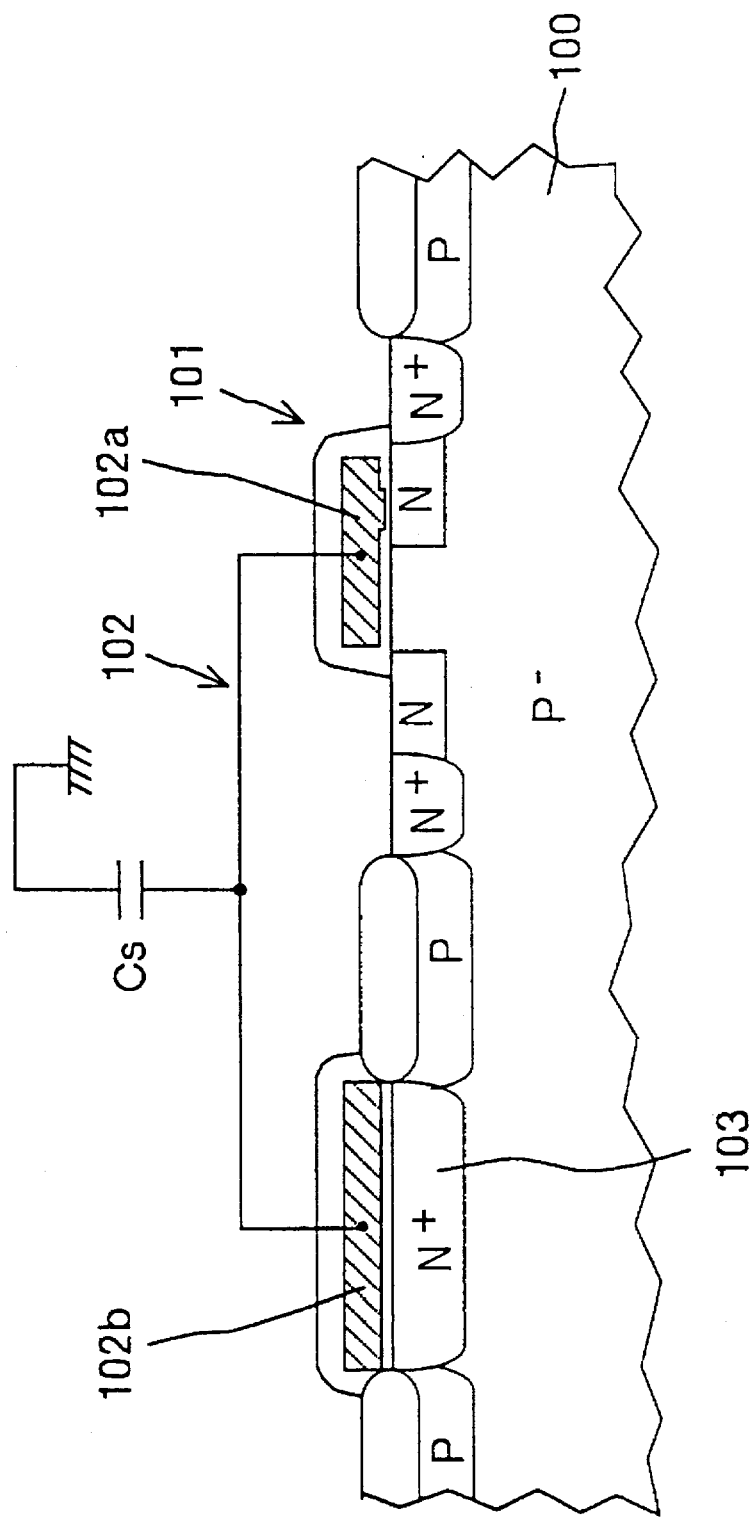
FIG. 21 is a sectional view of a conventional EEPROM.

As it is well known, an effect that hot electrons accelerated by a high electric field generated in a pinch-off region near a drain when a high voltage is applied to a control gate and drain are injected to a floating gate is utilized in writing data into the EPROM. Due to that, a MOS transistor having a high withstanding voltage has been necessary for writing in the past. However, the bipolar transistor having a high withstanding voltage may be used in the LSI of the present embodiment and MOS transistors having a high withstanding voltage need not be integrated. FIG. 20 shows an exemplary writing and reading circuit constructed by applying the present embodiment and by using the high withstanding voltage bipolar transistors.

In FIG. 20, the reference numeral Q3 denotes mono-layer gate SOI type EPROM memory cell transistor. As shown in FIG. 17, capacity electrode section 50 of floating gate F is connected to a power supply for writing EPROM Vpp (about 20 V) via N type region 35 (FIG. 20), N$^+$ source region 33 of an N channel type enhancement MOSFET having control electrode section 51 as its gate electrode is grounded. N$^+$ drain region 34 is connected to emitters of NPN transistors Q1 and Q4. The reference numeral Q2 denotes NPN transistor, Q5 P channel type enhancement MOSFET, R1 and R2 input resistances, I1 constant current power supply comprising the PNP transistor, Vcc 5 V circuit power supply, DIN input terminal of write and write collation control signals, EPR input terminal of a read control signal, and DOUT an EPROM memory output terminal. Diode D1 is provided to separate Vpp circuit and Vcc circuit, and diode D2 prevents a voltage applied to a drain of transistor Q3 from breaking down in the reverse direction between the emitter and the base of transistor Q4. A withstanding voltage of diodes D1 and D2 is more than 20V.

First, an operation during writing will be explained. A low level signal (normally 0 V) is applied to an EPR terminal and transistor Q4 is turned off. When a low level signal is applied to DIN terminal in this state, the NPN transistor Q2 is turned off. At this time, a voltage which has been lowered by a saturation voltage (normally 0.1 V) of the PNP transistor composing the constant current power supply I1 from Vpp (about 20 V) is applied to a base of the NPN transistor Q1 and the transistor Q1 is turned on. Accordingly, about 12.9 V (Vpp—saturation voltage—forward direction voltage between base and emitter of the transistor Q1 (about 0.7 V)), which is considerably higher than a normal circuit voltage (about 5 V), is applied to the emitter of the NPN transistor Q1, i.e., to the drain of the memory cell transistor Q3. The high Vpp voltage is applied to a gate of the memory cell transistor Q3 as it is. Accordingly, high voltages are applied between both the gate and source and the drain and source of the memory cell transistor Q3, electrons which flow from the source to the drain are injected to floating gate F while becoming hot electrons, and thereby a threshold value of MOSFET structure part of memory cell transistor Q3 is shifted. The written information is held even when the circuit power supply is cut off. Although an additional process for forming a transistor section having a higher withstanding voltage than that of a CMOS transistor in a logic section is necessary in order to realize a write circuit by the CMOS process because a high voltage is necessary to perform the write operation as described above, the process is not increased or complicated so much by applying the B1-CMOS process like the present embodiment and because memory cell transistor Q3 also has a mono-layer gate structure.

The power supply for writing Vpp is removed when reading, i.e., when the memory is actually used, and about 4.3 V (Vcc (5 V)—forward direction voltage of D1 (0.7 V)) is applied to the gate of the memory cell transistor Q3. A high level voltage (normally 5 V) is applied to the DIN terminal, turning on the transistor Q2 and turning off the transistor Q1. On the other hand, a high level voltage is applied also to the EPR terminal, turning on the transistor Q4.

When no electrons are injected to floating gate F of memory cell transistor Q3, memory cell transistor Q3 is turned on because 4.3 V is applied between the gate and source of memory cell transistor Q3. Accordingly, a current flows through a path of the loaded transistors Q5-Q4-Q3 and a voltage level of the DOUT terminal becomes low.

On the other hand, when electrons are injected to floating gate F, memory cell transistor Q3 remains off even if 4.3 V is applied between the gate and source of memory cell transistor Q3 because the threshold value of memory cell transistor Q3 has been shifted. Accordingly, no current flows through the path of the loaded transistors Q5-Q4-Q3 and the voltage level of DOUT terminal becomes high level. Thus, output from DOUT terminal changes corresponding to a write state.

Further, it is necessary to check that the output signal will not change by applying about 7 V between the gate and source when reading in order to check and select out one whose threshold shift amount after writing is initially small. This is called a write collation. Its operation will be now explained. The voltage of Vpp is set at about 7 V and is applied between the gate and source of memory cell transistor Q3. A high level voltage is applied to DIN terminal to turn on the transistor Q2 and turn off the transistor Q1. On the other hand, a high level voltage is applied also to EPR terminal to turn on the transistor Q4. If no electrons have been injected to floating gate F of memory cell transistor Q3, memory cell transistor Q3 is turned on and the voltage level of DOUT terminal becomes low level. On the other hand, if electrons have been injected to floating gate F and there exists enough of a threshold shift amount, output from DOUT terminal becomes high level even if 7 V has been applied between the gate and-source of memory cell transistor Q3. However, if the threshold shift amount is not enough, output from DOUT terminal turns out to be at a low level. The reliability of the EPROM may be improved by selecting one whose output has turned out to be low level.

Figure 18:
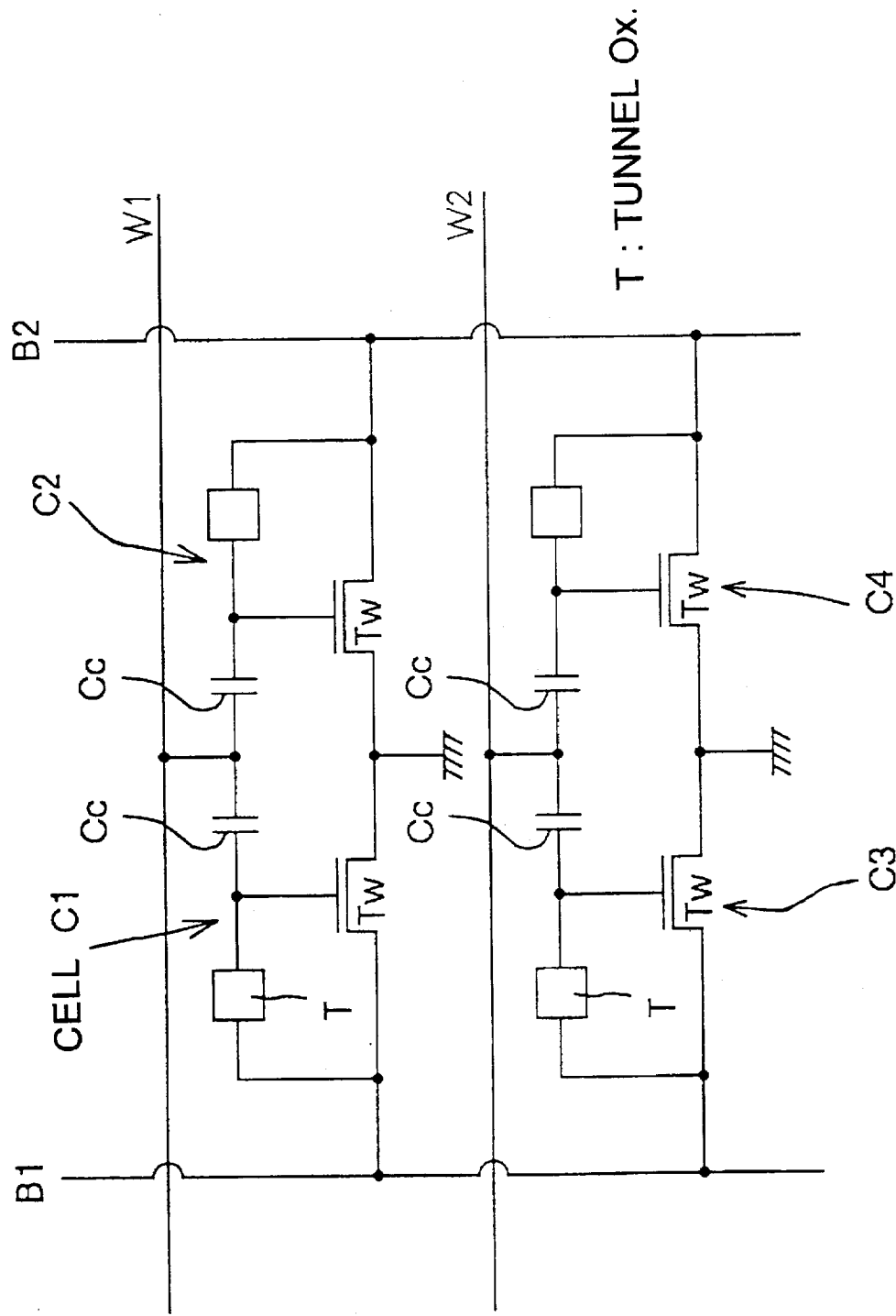
FIG. 18 is an equivalent circuit diagram of a memory cell matrix of the second embodiment.

Next, an operation of the memory cells in FIG. 17 which are arranged as a matrix array will be explained with reference to an equivalent circuit diagram in FIG. 18.

Reference numerals B1 and B2 denote bit lines of different columns, and W1 and W2 denote word lines of different rows.

Reading and writing operations of cells C1 and C2 located on a first row will be explained.

The reading operation is performed by applying a high level potential to the word line W1 and by detecting a potential change of the bit lines B1 and B2 by a sense amplifier (not shown). When no electrons have been injected to floating electrode F, the resistance of a floating gate transistor Tw becomes low and the potential difference of the corresponding bit line B1 or B2 connected to its drain is small. When electrons have been injected to floating electrode F, the resistance of floating gate transistor Tw becomes high and the potential change of the corresponding bit line B1 or B2 becomes large. Memory contents may be detected by detecting the potential change by the sense amplifier. At this time, a low level potential is applied to the word line W2 and floating gate transistors Tw of cells C3 and C4 are turned off.

Next, the writing operation will be explained. A high level potential (write control voltage) which is higher than the high level potential during reading is applied to word line W1, a high level potential is applied to bit line B1 and a low level potential is applied to bit line B2. At this time, a channel of floating gate transistor Tw of the cell C1 is turned on and is pinched off, injecting hot electrons to the gate electrode section 51 of floating electrode F. On the other hand, because a low level potential is being applied to an N, drain region of cell C2, a channel of its floating gate transistor Tw is not pinched off, no hot electrons are generated, and no electrons are injected to floating electrode F of the cell C2.

It is apparent that the same effect with that of the first embodiment is brought about also in the memory cell of EPROM of the present embodiment described above. It is also apparent that the line driver which drives the word lines W1 and W2 and the bit lines B1 and B2 may be constructed by CMOS inverters, npn bipolar transistors shown in FIG. 19 for example and lateral pnp bipolar transistors (not shown). Then, a high speed, low DC power consumption and high driving voltage memory can be realized.

While preferred embodiments have been described, variations thereto will occur to those skilled in the art within the scope of the present inventive concepts which are delineated by the following claims.

What is claimed is:

1. A programmable non-volatile memory cell, comprising:

a MOS transistor including a gate electrode defined on a surface of a semiconductor substrate;

a floating electrode including said gate electrode section and a capacity electrode section;

a control electrode comprising a semiconductor region disposed directly under said capacity electrode section, and an insulating film interposed between said semiconductor region and said capacity electrode section; and an insulator buried in said semiconductor substrate so as to abut a side and bottom of said semiconductor region composing said control electrode, thereby partially surrounding said semiconductor region of said control electrode.

2. The non-volatile memory cell according to claim 1, further comprising a second insulator surrounding a side and bottom of said MOS transistor.

3. A programmable non-volatile memory cell comprising:

a MOS transistor including a gate electrode defined on a surface of a semiconductor substrate;

a floating electrode including said gate electrode section and a capacity electrode section;

a control electrode comprising a semiconductor region disposed directly under said capacity electrode section and an insulating film interposed between said semiconductor region and said capacity electrode section; and an insulator surrounding a side and bottom of said semiconductor region composing said control electrode, wherein:

a source of said MOS transistor is connected to a ground line;

a drain of said MOS transistor is connected to a bit line; and said control electrode is connected to a word line.

4. The programmable non-volatile memory cell according to claim 3, wherein said drain of said MOS transistor is connected to said bit line via a selection transistor.

5. The programmable non-volatile memory cell according to claim 3, wherein a gate oxide film of said MOS transistor has a tunnel oxide region at a position near said drain of said MOS transistor.

6. A non-volatile memory cell according to claim 1, wherein said insulator comprises a first section underlying said semiconductor region in said semiconductor substrate and a second section isolating said semiconductor region from a region where said MOS transistor is disposed, said second section of said insulator extending from a surface of said semiconductor substrate through to said first section of said insulator.

7. A programmable non-volatile memory cell according to claim 1, wherein said control electrode further comprises:

a trench defined in said semiconductor region; and polysilicon disposed in said trench, and wherein a portion of said capacity electrode section is operatively connected to said polysilicon.

8. A programmable non-volatile memory cell according to claim 1, wherein said semiconductor region of said control electrodes comprises an n+ semiconductor layer, an n− semiconductor layer disposed on said n+ semiconductor layer, and an n semiconductor layer disposed on said n− semiconductor layer, said n semiconductor layer being proximal to said capacity electrode section.

9. A programmable non-volatile memory cell according to claim 1, further comprising:

a selection transistor having source region, a gate region, and a selection gate electrode operatively associated with said gate thereof, said selection transistor and said MOS transistor operatively coupled so as to define a memory cell;

a first word line operatively connected to said control electrode;

a second word line operatively connected to said selection gate electrode of said selection transistor;

a bit line operatively connected to said source and region of said selection transistor; and drive circuitry for providing signals on said first word line, said second word line, and said bit line so as to read data into said memory cell, write data to said memory cell, and erase said memory cell.

10. A programmable non-volatile memory cell according to claim 9, wherein said drive circuitry performs the following:
   1) writes high "1" data to said memory cell by applying a high potential to said first word line, said second word line, and said bit line;
   2) writes low "0" data to said memory cell by applying a high potential to said first word line and said second word line and a low potential to said bit line;
   3) reads data from said memory cell by applying a low potential to said first word line and by applying a high potential to said second word line and said bit line; and
   4) erases data from said memory cell by applying a low potential to said first word line, a high potential to said second word line, and a high erasing potential to said bit line, said high erasing potential being greater than said high potential.

11. A programmable non-volatile memory cell according to claim 9, wherein said drive circuitry comprises:
   an inverting amplifier defined by a pair of transistors capable of being selectively actuated so as to provide one of said high potential and said low potential on an output line; and
   a high erasing potential providing circuit selectively actuated for providing said high erasing potential on said output line.

12. A programmable non-volatile memory cell according to claim 11, wherein said inverting amplifier comprises:
   a first pnp transistor having an emitter operatively connected to said high potential, a base, and a collector; and
   a first npn transistor having a collector operatively connected to said collector of said first pnp transistor, an emitter operatively connected to ground, and a base, said collector of said first pnp transistor and said emitter of said first npn transistor being connected to said output line;

wherein said high erasing potential providing circuit comprises:
   a second pnp transistor having an emitter connected to said high erasing potential, a base, and a collector connected to said output line, and said drive circuitry further comprising:
   a first CMOS inverter having an output connected to said base of said first pnp transistor, said first CMOS inverter being connected to said high potential and a first potential, wherein a difference between said high potential and said first potential is less than a withstanding voltage of said first CMOS inverter;
   a second CMOS inverter having an output connected to said base of said first npn transistor, said first CMOS inverter being connected to and a second potential and ground; and
   a third CMOS inverter having an output connected to said base of said second pnp transistor, said third CMOS inverter being connected to said high erasing potential and a third potential, wherein a difference between said high erasing potential and said third potential is less than a withstanding voltage of said third CMOS inverter.

13. A programmable non-volatile memory cell, comprising:
   a MOS transistor including a gate electrode defined on a surface of a semiconductor substrate;
   a floating electrode including said gate electrode section and a capacity electrode section;
   a control electrode comprising a semiconductor region disposed directly under said capacity electrode section with an insulating film interposed between said semiconductor region and said capacity electrode section; and
   an insulator surrounding a side and bottom of said semiconductor region composing said control electrode, wherein said semiconductor region of said control electrode and said capacity electrode section directly abut said insulating film.

* * * * *